United States Patent [19]

Gaudenzi

[11] 4,251,737
[45] Feb. 17, 1981

[54] DOTTABLE ACTIVE COLLECTOR DRIVER CIRCUIT

[75] Inventor: Gene J. Gaudenzi, Purdys, N.Y.

[73] Assignee: International Business Machines Corporation, Hopewell Junction, N.Y.

[21] Appl. No.: 974,637

[22] Filed: Dec. 29, 1978

[51] Int. Cl.³ .................... H03K 19/013; H03K 19/08
[52] U.S. Cl. .................... 307/209; 307/217; 307/237; 307/280; 307/270
[58] Field of Search ............... 307/280, 300, 209, 237, 307/217, 270

[56] References Cited

U.S. PATENT DOCUMENTS

| | | | |
|---|---|---|---|
| 3,792,292 | 2/1974 | Priel | 307/209 |
| 3,868,517 | 2/1975 | Schoeff | 307/280 X |
| 4,042,840 | 8/1977 | Chan | 307/209 |
| 4,081,695 | 3/1978 | Allen et al. | 307/209 |

OTHER PUBLICATIONS

IBM Tech. Disclosure Bulletin, vol. 13, No. 5, 10-1970, "Single Shot Having Transistor Delay", by Adams et al.

Primary Examiner—John S. Heyman
Attorney, Agent, or Firm—Sughrue, Rothwell, Mion, Zinn and Macpeak

[57] ABSTRACT

Dotting capability is provided in a push/pull active collector type circuit by providing a clamping circuit to limit the current through the pull-up transistor and prevent current flow through that transistor when the output is pulled down via another driver.

5 Claims, 5 Drawing Figures

DOTTABLE ACTIVE COLLECTOR DRIVER CIRCUIT

BACKGROUND OF THE INVENTION

This invention relates to a high speed logic driver circuit, and more particularly to an active collector circuit which is capable of output dotting.

With advances in modern technology, increasing emphasis is being placed on system operating speed. One area in which operating speeds have become of paramount importance is in digital circuitry. In complex digital systems, it is often necessary that a plurality of stations be able to share a single communications buss, or common buss. In designing a common buss system, it has heretofore been necessary to reach a compromise between operating speed and system flexibility. This can be more clearly understood by referring to FIGS. 1 and 2.

In FIG. 1 an open collector-type driver circuit is illustrated. The load on the driver is represented by capacitor C. In response to a high level input at terminal A, transistors 10 and 20 will be turned on and $V_{out}$ will be at a low level. In response to a low level input at terminal A, transistors 10 and 20 will turn off and $V_{out}$ may assume a high level. This circuit is advantageous in that its output may be dotted with other circuits of this type. In other words, a plurality of driver circuits of the type shown in FIG. 1 may have their $V_{out}$ connected together so that the load may be driven to a low level if anyone of the plurality of commonly connected driver circuits has a low output voltage. The current drawn from any of the other driver circuits which may be in a high state can be kept to a minimum by providing a large resistance R. Even though the open collector circuit of FIG. 1 is advantageous in that it provides a dotting capability, it is unsatisfactory since the transition from low to high level output signals is very slow, being determined by the time constant RC. In high speed communications systems, this slow transition time is unacceptable.

An alternative to the slow-speed circuit of FIG. 1 is shown in FIG. 2. This circuit is known as a "THREE-STATE PUSH-PULL DRIVER" described in *IBM Technical Disclosure Bulletin*, Vol. 21, No. 1, June 1978, p. 172. The disadvantages of slow up-transition times have been eliminated by providing pull-up transistor 16 so that both up and down transitions are accomplished very rapidly. Note that when the input signal at A is high, transistors 11 and 14 will be on, providing a low output state, while a low input will turn off transistors 11 and 14 and turn on transistor 16 to provide a high output. The disadvantage in such a circuit is that, when output dotting is attempted by connecting outputs in common, catastrophic currents may flow through the transistor 16 when the pull-down transistor from one of the other driver circuits is turned on. Thus, it is necessary to provide inhibit inputs so that transistor 16 may be turned off even in the presence of a low input signal at A. When the inhibit inputs are driven to a up level, transistors 12 and 18 will turn on and transistors 14 and 16 will be simultaneously off. The open circuit condition thus created at the output will permit one of the other driver circuits to take command of the common buss. The inhibit circuitry shown in FIG. 2 as well as the three-state control logic required to drive it adds to the complexity and cost of the circuit while decreasing its reliability.

A third alternative as shown in FIG. 3 and is known as a "DOTTABLE PUSH-PULL DRIVER" described in *IBM Technical Disclosure Bulletin*, Vol. 21, No. 1, June 1978, pp. 233 to 234. In this circuit, transistor 22 is a pull-up transistor and transistor 24 is a pull-down transistor for fast switching in either direction. Output dotting capability is provided by transistor 26. The operation of the circuit of FIG. 3 is as follows:

First, if the input signal at A is high, transistor 24 will be on and V will be lower than $V_{ref}$. This will turn on transistor 26 which, in turn, will turn off transistor 22. The current draw in this state may be maintained at a low level by providing a very large resistance 28.

If the input signal at A switches down, transistor 24 will turn off and $V_{out}$ will begin rising at a rate determined by the RC time constant of resistor 28 and the capacitive load C. As soon as $V_{out}$ exceeds $V_{ref}$, transistor 26 will turn off, transistor 18 will turn on and $V_{out}$ will rise rapidly until it reaches a value of $V+ - V_{be}$ where $V_{be}$ is the base-emitter voltage of transistor 22. At this point, transistor 22 will turn off and $V_{out}$ continues to increase to a value of $V+$ at a rate again determined by the RC time constant.

When another such driver is output dotted, the operation of the driver of FIG. 3 is substantially the same. That is, with $V_{out}$ at a high level, the pull down transistor 30 from a another driver may be switched on. This will discharge the capacitive load to turn on transistor 26 which, in turn, switches off transistor 22.

The circuit of FIG. 3 has been found useful in many applications, but is unacceptable in some instances because of the slow $V_{out}$ rise at the beginning and end of the up transition. More seriously, there is a substantial possibility that the circuit will fail to operate unless certain safeguards are taken, which safeguards will further hamper the circuit operation. For example, the operation of transistor 26 depends upon the potential $V_{out}$ decreasing below $V_{ref}$. $V_{ref}$ is typically chosen to be approximately 1 volt while $V+$ may be approximately 3 volts. With $V_{out}$ in a high state, it is approximately equal to three volts. When one of the pull down transistors is turned on, $V_{out}$ will initially decrease and current will be supplied through transistor 22. The ability of the circuit of FIG. 3 to operate properly will depend upon the ability of the pull down transistor to draw off the current from the capacitive load at a rate faster than it will be supplied by transistor 22, as otherwise the potential will never decrease below $V_{ref}$. The circuit may operate satisfactorily alone, but when one or two additional circuits are output dotted, there will be three transistors 22 all supplying current in parallel, and it is probable that this will be sufficient to prevent the voltage $V_{out}$ from ever dropping below $V_{ref}$. Thus, if operable at all, the circuit of FIG. 3 is severely limited in its dotting capability.

As will be apparent from the above discussion of prior art driver circuits, there is a need for an active collector driver circuit which is capable of output dotting, is less complex and more reliable than previously used tri-state driver circuits and is also capable of high operating speeds.

SUMMARY OF THE INVENTION

Accordingly, it is an object of this invention to provide a driver circuit which exhibits the high-speed operating characteristics of push-pull driver circuits and is also capable of output dotting.

It is a further object of the present invention to provide such a circuit which is significantly less complex and more reliable than existing tri-state driver circuits.

Briefly, and in accordance with the present invention, these and other objects are achieved by providing an active collector driver with a clamping circuit to permit the pull-up transistor to supply large currents during the up transition but limit the current supplied by the up transistor to a negligible value during steady-state conditions. The catastrophic output currents which might occur in previous active collector drivers during output dotting is positively prevented by limiting the current through the pull-up transistor before one of the other pull-down transistors is switched on. This will permit very rapid switching during transitions in either direction, will hold the stand-by current draw to a minimum and, most importantly, will positively prevent short circuit current through the pull-up transistor without having to rely on the ability of a single pull-down transistor to draw off current from the capacitive load at a rate faster than it can be supplied by all of the combined pull-up transistors.

BRIEF DESCRIPTION OF THE DRAWINGS

The present invention will be more clearly understood by referring to the accompanying drawings, in which.

DETAILED DESCRIPTION OF THE INVENTION

Figure 1:
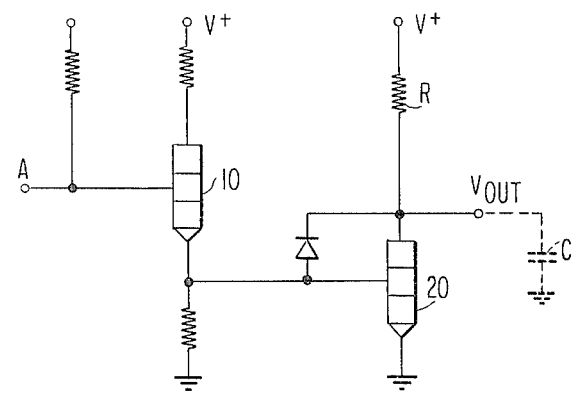
FIG. 1 is a simple schematic diagram of an open collector driver circuit.
Figure 2:
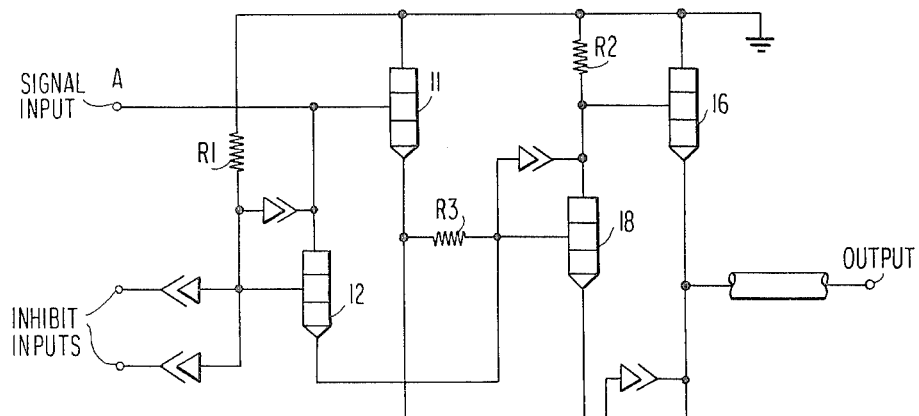
FIG. 2 is a schematic diagram of a known three-stated push-pull driver circuit.
Figure 3:
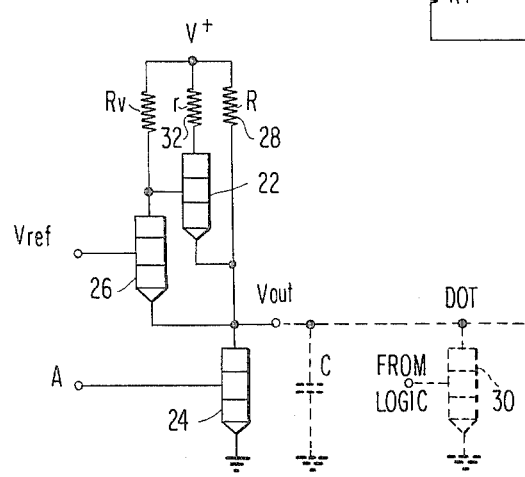
FIG. 3 is a schematic diagram of a dottable push-pull driver circuit known in the art.

The present invention will now be described with reference to FIG. 4.

The circuit illustrated therein is an active collector type driver in which resistors 34 to 44 and transistors 46 to 52 constitute a standard push-pull driver circuit which is useful in driving reasonable capacitive loads. In response to a high level input signal, transistors 46 and 52 will turn on while transistors 48 and 50 will turn off, thus providing a low level output signal $V_{out}$. When the input signal level is low, transistors 46 and 52 will be off while transistors 48 and 50 will be on, thus providing a high level output level signal $V_{out}$. Thus, transistor 52 acts as a switch for selectively applying a low voltage at the driver output, transistors 48 and 50 act as a switch for selectively applying a high voltage at the driver output and transistor 46 acts as a means for supplying 180° out-of-phase control signals to the two switches. This type of operation is well known.

The novel and advantageous features of the present invention reside in the addition of resistor 54 and transistors 56 and 58. These additional components limit the current from transistor 50 during steady-state operation and prevent catastrophic currents from flowing therethrough when the output is pulled down by another driver. The operation of the circuitry of FIG. 4 with the additional components will now be described.

When a high level input is received, transistors 56, 46 and 52 are turned on and transistors 58, 48 and 50 are turned off to provide a low level output $V_{out}$. Under this condition, transistor 56 is operating in saturation. When one of the inputs is pulled down, transistors 56, 46 and 52 turn off and transistors 48 and 50 turn on, thus providing a current spike to raise the output voltage $V_{out}$. Due to the saturated condition of transistor 56, it will not turn off at its collector node for a short period of time after the transition in the input level, and the voltage at the base of transistor 58 will thus remain low for a short period of time. The delay period will be determined by the saturation level set by resistor 34 and the RC time constant established by resistor 54 connected to the base of transistor 58. Transistor 58 will thus remain off as the output voltage $V_{out}$ is permitted to rise. When transistor 56 comes out of saturation, the base voltage of transistor 58 will rise, thus turning on transistor 58 which, in turn, will lower the base voltage of transistor 48. This results in transistors 48 and 50 being turned off, but the output voltage has already risen beyond the threshold level required for information to be detected on the common buss.

The dotting operation of the circuitry FIG. 4 will now be described. If the circuit of FIG. 4 is in a steady-state condition in which a high level output signal is being provided, transistors 48 and 50 are off and the only current being provided is perhaps 0.4 ma flowing in transistor 58. If the pull-down transistor from another driver is turned on, the output level may be pulled down and the only current that would flow from the driver of FIG. 4 would be approximately 1.5 ma flowing in transistor 58. Transistor 50 would remain off, and destructive currents would be prevented. If, on the other hand, the driver circuit of FIG. 4 were in a steady state condition in which transistor 52 was conducting and the output was at a low level, the simultaneous switching to a high level of the output from one of the dotted driver circuits would result in a high current (approximately 40 ma) flowing in the transistor 50 of the dotted driver but this current would only last for a few ns until transistor 56 of the other driver came out of saturation.

The advantages provided by the dottable active collector driver circuit according to the present invention are that a large number of driver circuits may be dotted, high speed switching in both directions is provided by the push-pull transistors and complicated tri-state logic control circuitry is not required. Further, in the event of a logical error, no catastrophic currents will flow since, even in steady-state operation, the pull-up transistor 50 is turned off.

Figure 4:
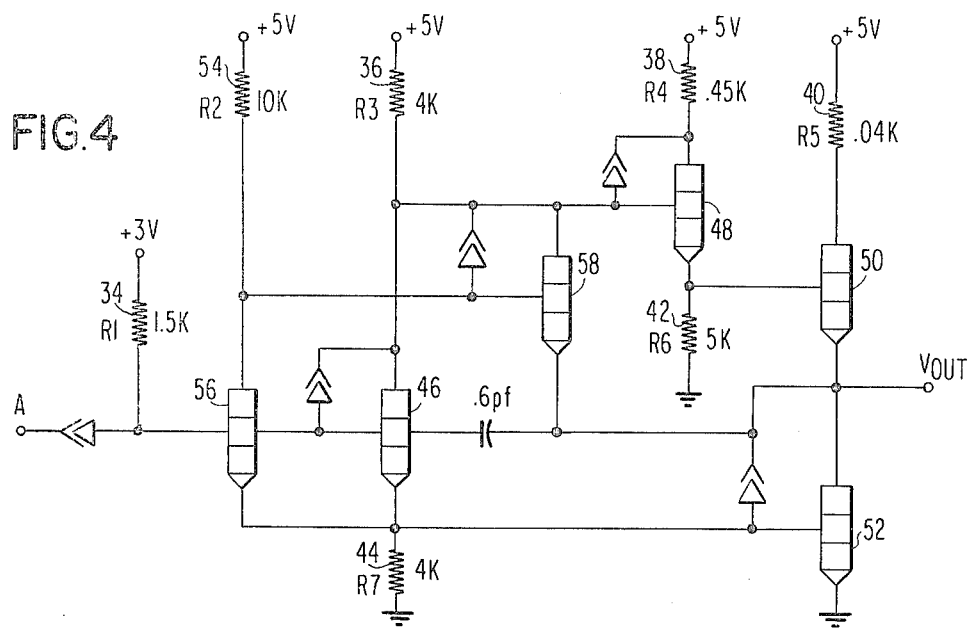
FIG. 4 is a schematic diagram of a dottable active collector driver circuit according to the present invention.
Figure 5:
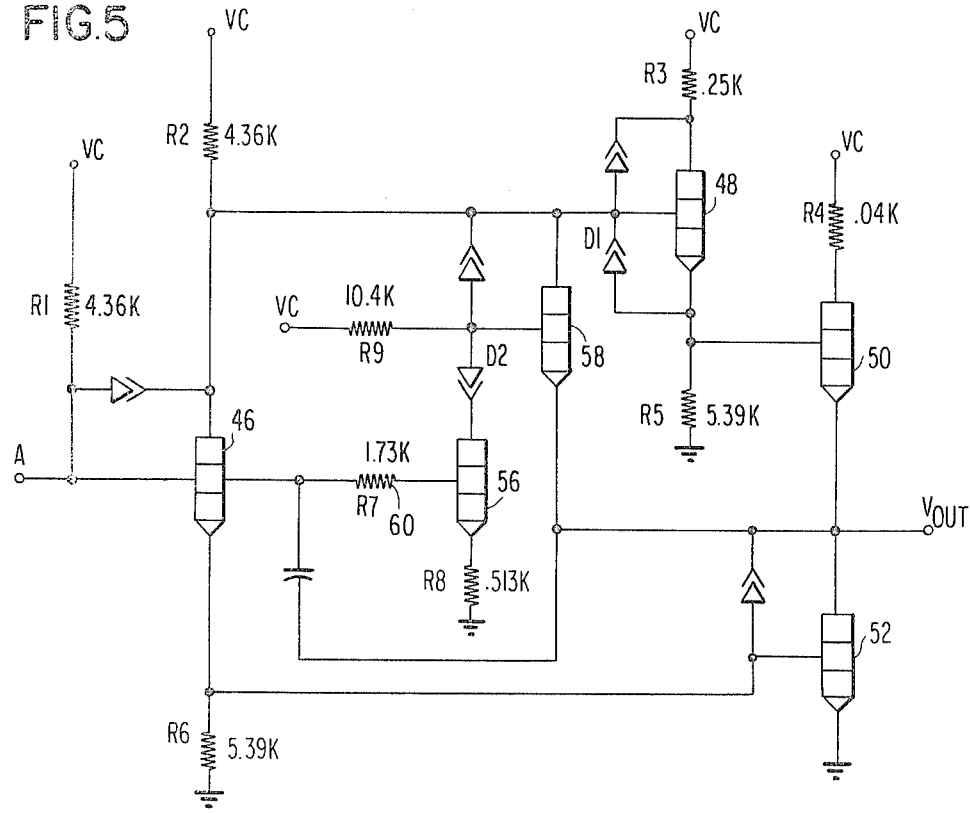
FIG. 5 is a schematic diagram of a modified version of the circuit shown in FIG. 4.

The circuit of FIG. 5 is substantially the same as that of FIG. 4. The positions of transistors 46 and 56 have been interchanged but their electrical connections are equivalent. Also, the various resistances have different values. Schottkey diode D1 has been added between the emitter and base of transistor 48 and another diode D2 has been included to protect transistor 56 from any large negative voltages which may be imposed on the driver output. The operation of the FIG. 5 driver is the same as that of FIG. 4 and need not be described.

In either of the two illustrated circuits, the clamping of transistor 58 which disables transistors 48 and 50 is delayed such that it does not interfere with the pull-up transistors 48 and 50. Thus, high switching speeds in either direction are achieved, circuit complexity is decreased while reliability is increased and output dotting is permitted with a large number of drivers.

It will be appreciated that, although only two specific circuits have been illustrated, the present invention is not limited thereto and that various modifications could be made to the disclosed circuitry without departing from the spirit and scope of the invention as defined in the appended claims. For example the disclosed circuits all utilize npn transistors to perform switching while pnp transistors, tubes or other switching devices would also be suitable with minor modifications to the circuitry.

What is claimed is:

1. A dottable active collector drive circuit, comprising
    a first switch means having a control terminal and an output terminal for selectively turning on to provide a low potential to its output terminal in response to a control signal at its control terminal;
    a second switch means having a control terminal and an output terminal for selectively turning on to provide a high potential to its output terminal in response to a control signal at its control terminal, the output terminals of said first and second switch means being connected together to form an output terminal of said driver circuit;
    means for supplying 180° out-of-phase control signals to said first and second switch means in response to an input to said driver circuit;
    disabling means for disabling said second switch means following a low potential-to-high potential transition in the output of said drive circuit; and
    delay means for delaying the operation of said disabling means until after said driver circuit output voltage has risen to a predetermined value.

2. A dottable active collector driver circuit as defined in claim 1, wherein said disabling means comprises a clamping transistor for limiting the voltage of the control terminal of said second switch means.

3. A dottable active collector driver circuit as defined in claims 1 or 2, wherein said delay means comprises a transistor which operates in saturation during steady-state driver operation with a low-level driver output, and which comes out of saturation only after said driver circuit output voltage has reached said predetermined value.

4. A dottable active collector driver circuit as defined in claim 3, wherein said first and second switch means comprise transistors and said disabling means comprises a transistor having an input terminal coupled to the control terminal of said second switch means, an output terminal coupled to the combined output terminals of said first and second switch means and a control terminal coupled to said delay means.

5. A dottable active collector driver circuit as defined in claim 4, wherein all of said transistors are npn transistors with the collector of said delay transistor being coupled to the base of said disabling transistor.

* * * * *